(12) United States Patent
Baker et al.

(10) Patent No.: US 7,642,591 B2
(45) Date of Patent: Jan. 5, 2010

(54) MULTI-RESISTIVE INTEGRATED CIRCUIT MEMORY

(75) Inventors: R. Jacob Baker, Meridian, ID (US); Kurt D. Beigel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 650 days.

(21) Appl. No.: 11/379,441

(22) Filed: Apr. 20, 2006

(65) Prior Publication Data

US 2006/0198179 A1 Sep. 7, 2006

Related U.S. Application Data

(60) Division of application No. 10/318,971, filed on Dec. 13, 2002, now Pat. No. 7,109,545, which is a continuation of application No. 09/940,328, filed on Aug. 27, 2001, now Pat. No. 6,509,245, which is a division of application No. 09/838,526, filed on Apr. 19, 2001, now Pat. No. 6,410,955.

(51) Int. Cl.
    *H01L 41/00* (2006.01)
(52) U.S. Cl. ............... 257/306; 257/307; 257/309
(58) Field of Classification Search ......... 257/306–307, 257/309
    See application file for complete search history.

(56) References Cited

U.S. PATENT DOCUMENTS

| | | |
|---|---|---|
| 4,617,481 A | 10/1986 | Masuda |
| 5,049,517 A | 9/1991 | Liu et al. |
| 5,059,920 A | 10/1991 | Anderson et al. |
| 5,082,797 A | 1/1992 | Chan et al. |
| 5,142,438 A | 8/1992 | Reinberg et al. |
| 5,162,248 A | 11/1992 | Dennison et al. |
| 5,185,282 A | 2/1993 | Lee et al. |
| 5,238,862 A | 8/1993 | Blalock et al. |
| 5,266,512 A | 11/1993 | Kirsch |
| 5,281,548 A | 1/1994 | Prall |
| 5,300,801 A | 4/1994 | Blalock et al. |
| 5,384,152 A | 1/1995 | Chu et al. |
| 5,436,188 A | 7/1995 | Chen |
| 5,583,359 A | 12/1996 | Ng et al. |
| 5,595,928 A | 1/1997 | Lu et al. |
| 5,597,756 A | 1/1997 | Fazan et al. |
| 5,652,170 A | 7/1997 | Keller et al. |

(Continued)

FOREIGN PATENT DOCUMENTS

JP 01-283860 11/1989

OTHER PUBLICATIONS

Burns and Bond, "Principles of Electronic Circuits", *West Publishing Company*, 1st Edition,(1987),390-396.

(Continued)

*Primary Examiner*—Laura M Menz
(74) *Attorney, Agent, or Firm*—Schwegman, Lundberg & Woessner, P.A.

(57) ABSTRACT

A capacitor for use in integrated circuits comprises a layer of conductive material. The layer of conductive material including at least a first portion and a second portion, wherein the first portion and the second portion are arranged in a predetermined pattern relative to one another to provide a maximum amount of capacitance per semiconductor die area.

7 Claims, 9 Drawing Sheets

U.S. PATENT DOCUMENTS

| | | |
|---|---|---|
| 5,658,381 A | 8/1997 | Thakur et al. |
| 5,700,731 A | 12/1997 | Lin et al. |
| 5,744,387 A | 4/1998 | Tseng |
| 5,759,894 A | 6/1998 | Tseng et al. |
| 5,792,680 A | 8/1998 | Sung et al. |
| 5,849,624 A | 12/1998 | Fazan et al. |
| 5,851,898 A | 12/1998 | Hsia et al. |
| 5,885,865 A | 3/1999 | Liang et al. |
| 5,902,126 A | 5/1999 | Hong et al. |
| 5,920,763 A | 7/1999 | Schuegraf |
| 5,933,725 A | 8/1999 | Kirsch et al. |
| 5,943,582 A | 8/1999 | Huang et al. |
| 5,985,732 A | 11/1999 | Fazan et al. |
| 6,010,942 A | 1/2000 | Chien et al. |
| 6,025,624 A | 2/2000 | Figura |
| 6,037,213 A | 3/2000 | Shih et al. |
| 6,037,219 A | 3/2000 | Lin et al. |
| 6,037,234 A | 3/2000 | Hong et al. |
| 6,077,742 A | 6/2000 | Chen et al. |
| 6,087,217 A | 7/2000 | Li et al. |
| 6,100,136 A | 8/2000 | Lin et al. |
| 6,100,137 A | 8/2000 | Chen et al. |
| 6,103,568 A | 8/2000 | Fujiwara |
| 6,130,835 A | 10/2000 | Scheuerlein |
| 6,133,600 A | 10/2000 | Sandhu |
| 6,159,793 A | 12/2000 | Lou |
| 6,166,941 A | 12/2000 | Yoshida et al. |
| 6,174,769 B1 | 1/2001 | Lou |
| 6,174,782 B1 | 1/2001 | Lee |
| 6,174,817 B1 | 1/2001 | Doshi et al. |
| 6,177,309 B1 | 1/2001 | Lee |
| 6,177,320 B1 | 1/2001 | Cho et al. |
| 6,180,452 B1 | 1/2001 | Figura |
| 6,187,624 B1 | 2/2001 | Huang |
| 6,190,960 B1 | 2/2001 | Noble |
| 6,194,229 B1 | 2/2001 | Basceri |
| 6,194,262 B1 | 2/2001 | Noble |
| 6,194,265 B1 | 2/2001 | Chang et al. |
| 6,214,688 B1 | 4/2001 | Hwang et al. |
| 6,215,187 B1 | 4/2001 | Ooto et al. |
| 6,218,239 B1 | 4/2001 | Huang et al. |
| 6,258,662 B1 | 7/2001 | Wang et al. |
| 6,261,900 B1 | 7/2001 | Liao et al. |
| 6,274,428 B1 | 8/2001 | Wu |
| 6,294,420 B1 | 9/2001 | Tsu et al. |
| 6,319,789 B1 | 11/2001 | Carstensen |
| 6,329,683 B2 | 12/2001 | Kohyama |
| RE37,505 E | 1/2002 | Blalock et al. |
| 6,352,866 B1 | 3/2002 | Basceri |
| 6,362,043 B2 | 3/2002 | Noble |
| 6,363,000 B2 | 3/2002 | Perner et al. |
| 6,368,913 B1 | 4/2002 | Yamamoto |
| 6,372,572 B1 | 4/2002 | Yu et al. |
| 6,373,084 B2 | 4/2002 | Figura |
| 6,385,020 B1 | 5/2002 | Shin et al. |
| 6,403,444 B2 | 6/2002 | Fukuzumi et al. |
| 6,410,955 B1 * | 6/2002 | Baker et al. ............. 257/307 |
| 6,417,065 B1 | 7/2002 | Wu et al. |
| 6,444,538 B2 | 9/2002 | Kwon et al. |
| 6,448,146 B1 | 9/2002 | Lee et al. |
| 6,451,667 B1 | 9/2002 | Ning |
| 6,458,653 B1 | 10/2002 | Jang |
| 6,462,979 B2 | 10/2002 | Schlosser et al. |
| 6,483,194 B2 | 11/2002 | Sakao |
| 6,509,245 B2 * | 1/2003 | Baker et al. ............. 438/396 |
| 6,537,874 B2 | 3/2003 | Nakamura et al. |
| 6,576,946 B1 * | 6/2003 | Kanai et al. ............. 257/306 |
| 6,838,719 B2 | 1/2005 | Hwang et al. |
| 6,888,217 B2 | 5/2005 | Gilgen et al. |
| 6,913,966 B2 * | 7/2005 | Baker et al. ............. 438/240 |
| 7,109,545 B2 * | 9/2006 | Baker et al. ............. 257/306 |
| 7,115,970 B2 | 10/2006 | Gilgen et al. |
| 2001/0008784 A1 | 7/2001 | Noble |
| 2002/0155677 A1 * | 10/2002 | Baker et al. ............. 438/396 |
| 2003/0089940 A1 * | 5/2003 | Baker et al. ............. 257/309 |
| 2003/0089941 A1 * | 5/2003 | Baker et al. ............. 257/309 |
| 2004/0245559 A1 | 12/2004 | Pontoh et al. |
| 2004/0245560 A1 | 12/2004 | Pontoh et al. |
| 2005/0051826 A1 | 3/2005 | Blalock et al. |
| 2005/0051827 A1 | 3/2005 | Blalock et al. |
| 2005/0090070 A1 | 4/2005 | Gilgen et al. |
| 2005/0219927 A1 * | 10/2005 | Baker et al. ............. 365/210 |
| 2006/0198179 A1 * | 9/2006 | Baker et al. ............. 365/145 |

OTHER PUBLICATIONS

Gray & Meyer, "Analysis and Design of Analog Integrated Circuits", *John Wiley & sons, Inc.*, 3rd Edition,(1993),168-170.

Van Zant, Peter, "Microchip Fabrication—A Practical Guide to Semiconductor Processing, McGraw-Hill, 4th Edition", *McGraw-Hill*, (2000),503-505.

Watanabe, et al., "An Advanced Technique for Fabricating Hemispherical-Grained (HSG) Silicon Storage Electrodes" *IEEE Transactions on Electron Devices*, vol. 42,No. 2, (Feb. 1995),295-300.

Yamamoto, I, "Low-Temperature Metal/ON/HSG-Cylinder Capacitor Process for High Density Embedded DRAMs,", *Symposium on VLSI Technology Digest of Technical Papers*, (1999),157-158.

* cited by examiner

MULTI-RESISTIVE INTEGRATED CIRCUIT MEMORY

This application is a Divisional of U.S. application Ser. No. 10/318,971, filed Dec. 13, 2002 now U.S. Pat. No. 7,109,545, which is a Continuation of U.S. application Ser. No. 09/940,328, filed Aug. 27, 2001, now U.S. Pat. No. 6,509,245, which is a Divisional of U.S. application Ser. No. 09/838,526, filed Apr. 19, 2001, now U.S. Pat. No. 6,410,955.

FIELD OF THE INVENTION

The present invention relates generally to electronic circuits, and more particularly to a capacitor for use in integrated circuits.

BACKGROUND INFORMATION

There is a continuing demand for integrated circuits to perform more functions or operations in shorter periods of time. This typically requires additional components to perform the additional functions, store more data and operate more efficiently. At the same time packaging requirements are decreasing. Consumers want smaller, lighter weight products that do more and are more mobile or portable. Accordingly, circuit designers are challenged to provide more components or greater capacity per unit of area on a semiconductor die. Most electronic circuits include basic electrical components such as transistors, resistors, inductors, capacitors and the like. Capacitors are one component that can occupy a lot of area on a semiconductor die depending upon the size of the capacitor. Capacitors are typically made by depositing a first metal plate, depositing a layer of insulation material over the first metal plate and then depositing a second metal plate over the layer of insulation material and parallel to the first metal plate. The size of the capacitance will be a function of the surface area of the two facing parallel plates and other parameters such as the dielectric constant of the insulation material and the spacing between the plates. Accordingly, one primary means of increasing the capacitance, is to increase the size of each of the parallel plates but this will consume more area on the semiconductor die.

Additionally, in some circuits it may be desirable for the capacitor to be independent of voltage and frequency applied across the capacitor once it is charged to a predetermined level. For example, a capacitor may be connected to the non-inverting input of an operational amplifier to reduce or cancel the offset voltage inherent in the operational amplifier. The capacitor may be pre-charged to the opposite polarity of the offset voltage of the amplifier so that the offset voltage is canceled during normal operation of the amplifier. When an input voltage signal is applied to the input of the operational amplifier, the output voltage signal will be stable and uninfluenced by the offset voltage if the capacitor is voltage and frequency independent.

Accordingly, for the reason stated above, and for other reasons that will become apparent upon reading and understanding the present specification, there is a need for a capacitor that maximizes the amount of capacitance per unit of area of a semiconductor die and that is independent of voltage and frequency.

BRIEF DESCRIPTION OF THE DRAWINGS

In the drawings like reference numerals describe substantially similar components throughout the several views. Like numerals having different letter suffixes represent different instances of substantially similar components.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Figure 1:
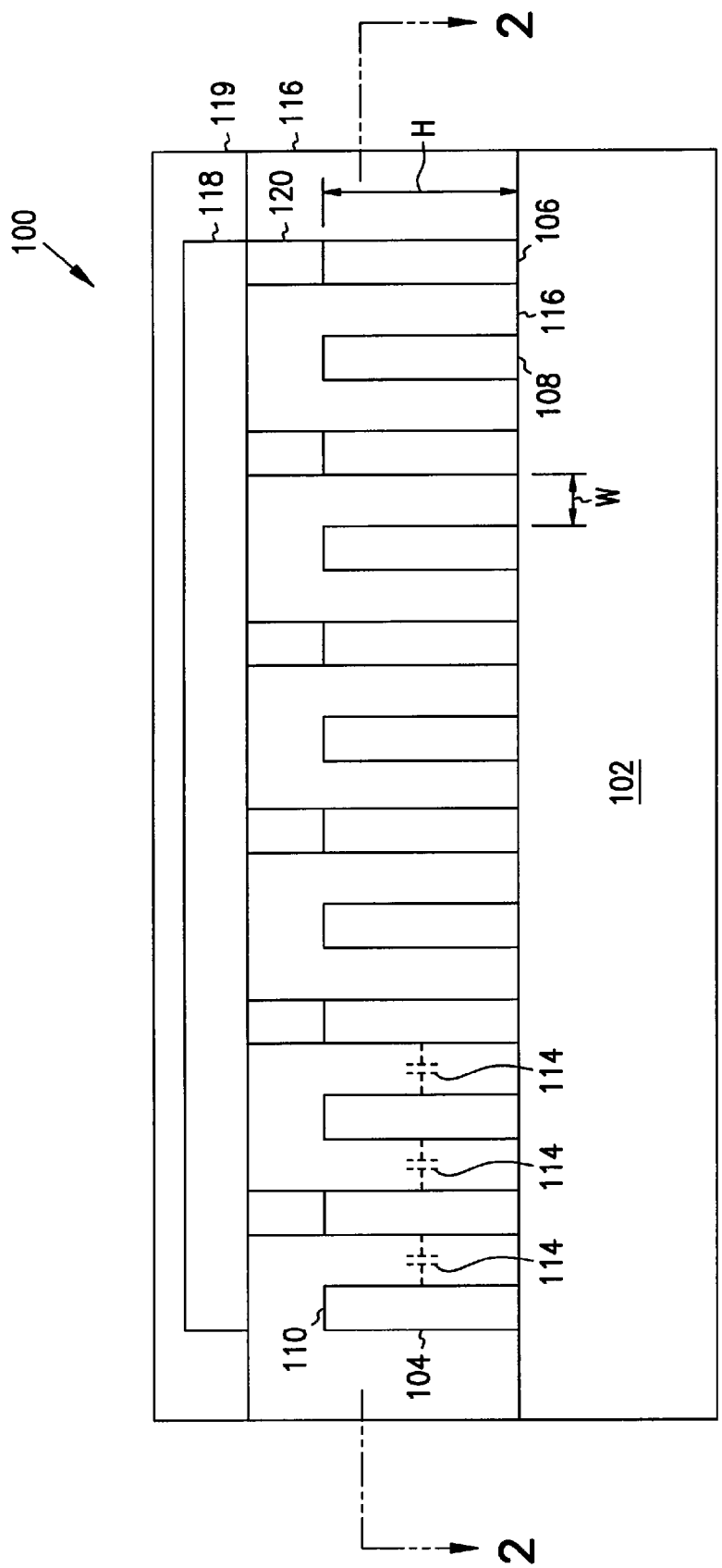
FIG. 1 is a side elevation view of a capacitor in accordance with one embodiment of the present invention.
Figure 2:
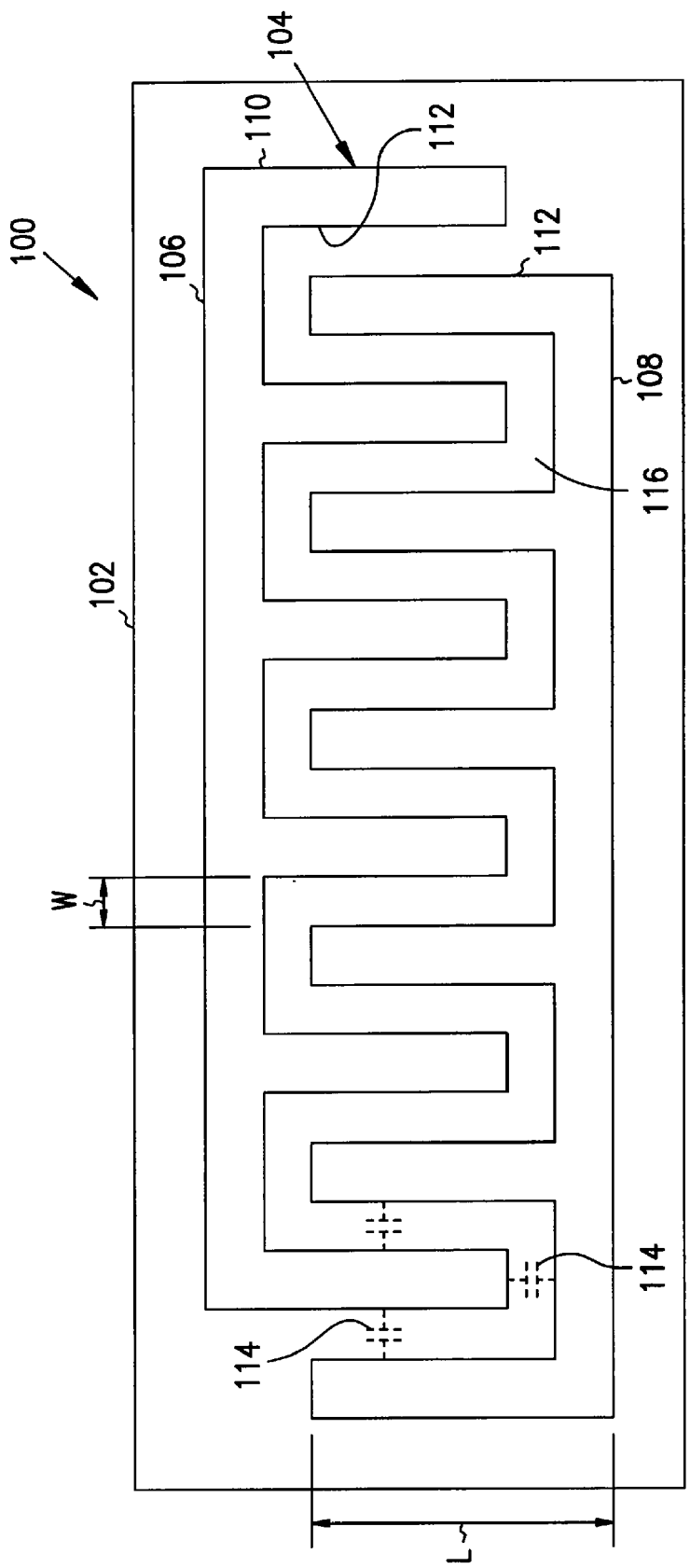
FIG. 2 is a cross-section view of the capacitor of FIG. 1 taken along lines 2-2.

Referring to FIGS. 1 and 2, FIG. 1 is a side elevation of a capacitor 100 in accordance with the present invention. The capacitor 100 may be formed on a substrate 102 or semiconductor wafer. A layer 104 of conductive material is deposited on the substrate 102 by chemical vapor deposition (CVD) or similar techniques to a selected height "H." The conductive layer 104 may be tungsten. The conductive layer 104 is then etched by photo resistive techniques, mechanical etching or the like to form a first portion 106 and a second portion 108 arranged in a predetermined pattern relative to one another to provide a maximum amount of juxtaposed surface area between the first and second portions 106 and 108 and accordingly a maximum amount of capacitance per unit of area of the substrate 102 or semiconductor wafer on which the capacitor 100 is formed. In accordance with one embodiment of the invention, the predetermined pattern of the first portion 106 and the second portion 108 may be substantially comb-like structures as shown in FIG. 2. Each of the first and second portions 106 and 108 include a plurality of teeth 110. Each tooth 110 has a sidewall 112 with a selected height "H" corresponding to the height of the conductive layer 104 and length "L" to provide a selected surface area facing a juxtaposed surface area of the other portion 106 or 108. The capacitor 100 is then formed by the juxtaposed sidewalls 112 of the teeth 110 of the first and second portions 106 and 108 corresponding to parallel plates of a capacitor as illustrated by the standard capacitor symbols 114 shown by broken lines between the sidewalls 112 in FIGS. 1 and 2. The interleaved teeth 110 of the comb-like structures of first and second portions 106 and 108 provide a maximum amount of capacitance per unit of area of the substrate 102.

In the predetermined pattern, the first and second portions 106 and 108 are separated by a substantially serpentine-shaped gap of a selected width "W." A layer of insulation material 116 is deposited over and between the first and second portions 106 and 108. The value or amount of the capacitance formed by the first and second portions 106 and 108 will be a function of the surface area of the juxtaposed sidewalls 112, the width W of the gap between the first and second portions 106 and 108 and the dielectric constant of the insulation layer 116. Accordingly, the value or amount of the capacitance may be predetermined by selecting the length L and height H of the juxtaposed sidewalls 112 to provide a selected surface area, choosing the width of the gap W and selecting the dielectric constant of the insulation layer 116.

While the predetermined pattern of the first and second portions 106 and 108 have been described an a substantially comb-like structure, it should be noted that other patterns may be used as well to provide a predetermined or desired capacitance. Interconnected strips of material of a selected height and width that are interleaved with other interconnected strips of material may be used to provide the desired capacitance value.

In accordance with one embodiment of the present invention shown in FIG. 1, a reference plate 118 of conductive or semiconductive material may be disposed on the insulation layer 116 and over the first and second portions 106 and 108. The reference plate 118 is electrically connected to one of the first or second portions 106 or 108 by at least one contact or plug 120. The plugs may be formed by creating vias or holes through the insulation layer 116 and then depositing a conductive material in the via in contact with the first portion 106 or the second portion 108. The plugs 120 may be formed from tungsten, copper, aluminum or the like. The reference plate 118 will provide further capacitance between itself and the one of the first or second portions 106 or 108 that is not electrically connected to the reference plate 118. The reference plate 118 is then preferably covered by another insulation layer 119. While the reference plate 118 is shown in FIG. 1 and being disposed over the first and second portions 106 and 108, the reference plate 118 could have also been formed on the substrate 102 first and then the first and second portions 106 and 108 could have been formed over the reference plate 118.

Figure 3:
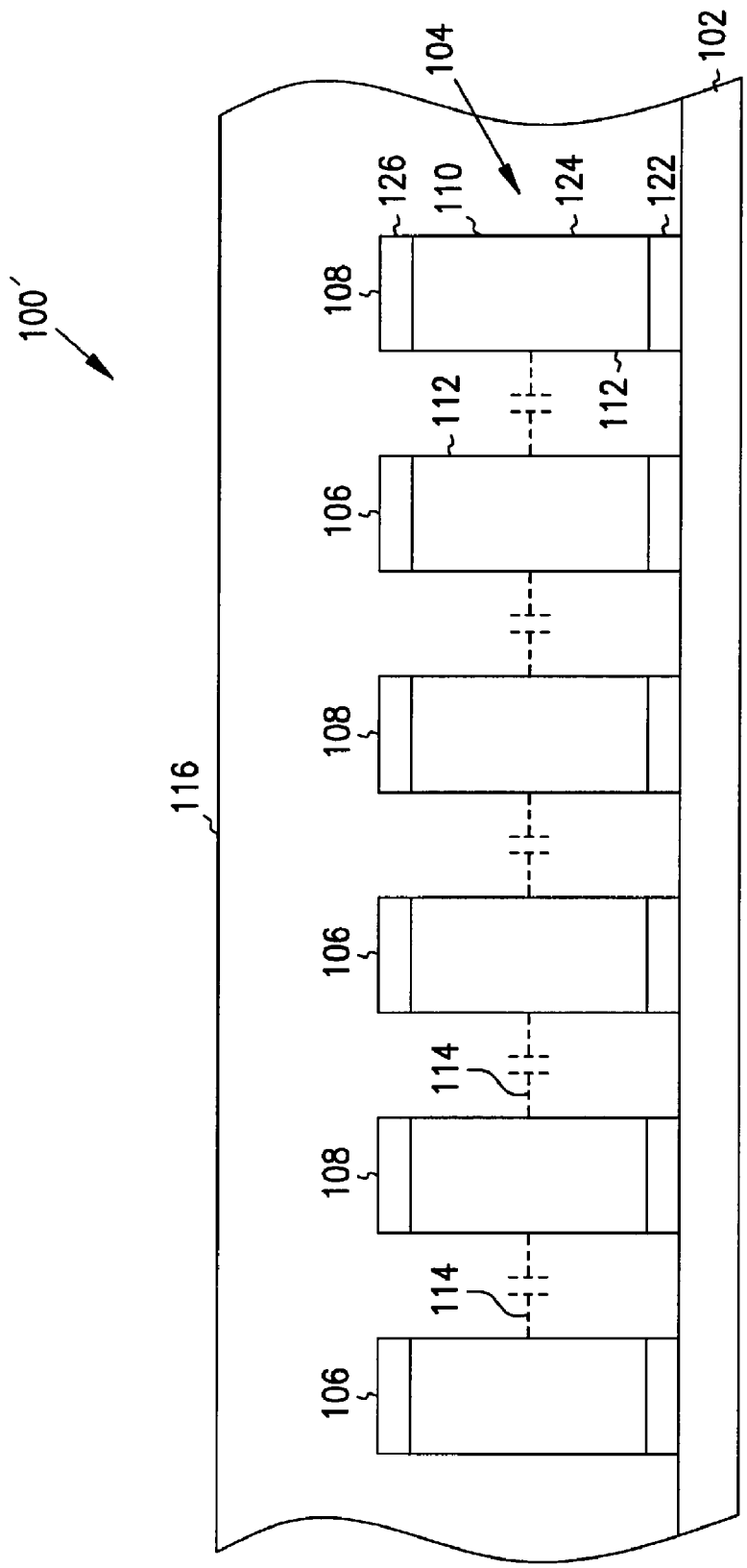
FIG. 3 is a partial side elevation view of a capacitor in accordance with another embodiment of the present invention.

In another embodiment of the present invention shown in FIG. 3, the layer of conductive material 104 may include a first layer of metalization, semiconductor material or polysilicon 122, a second layer of tungsten 124 disposed over the first layer of metalization 122 and a third layer of metalization, semiconductor material or polysilicon 126 or polysilicon disposed over the second layer of tungsten 124. All three layers 122, 124 and 126 are then etched to form the teeth 110 of the first and second portions 106 and 108. The capacitance 100' is therefore created between the sidewalls 112 as illustrated by the capacitor symbols 114 in broken lines and between the metalization layers 122 and 126. The metalizations layers 122 and 126 may be much thinner than the tungsten layer 124.

Figure 4:
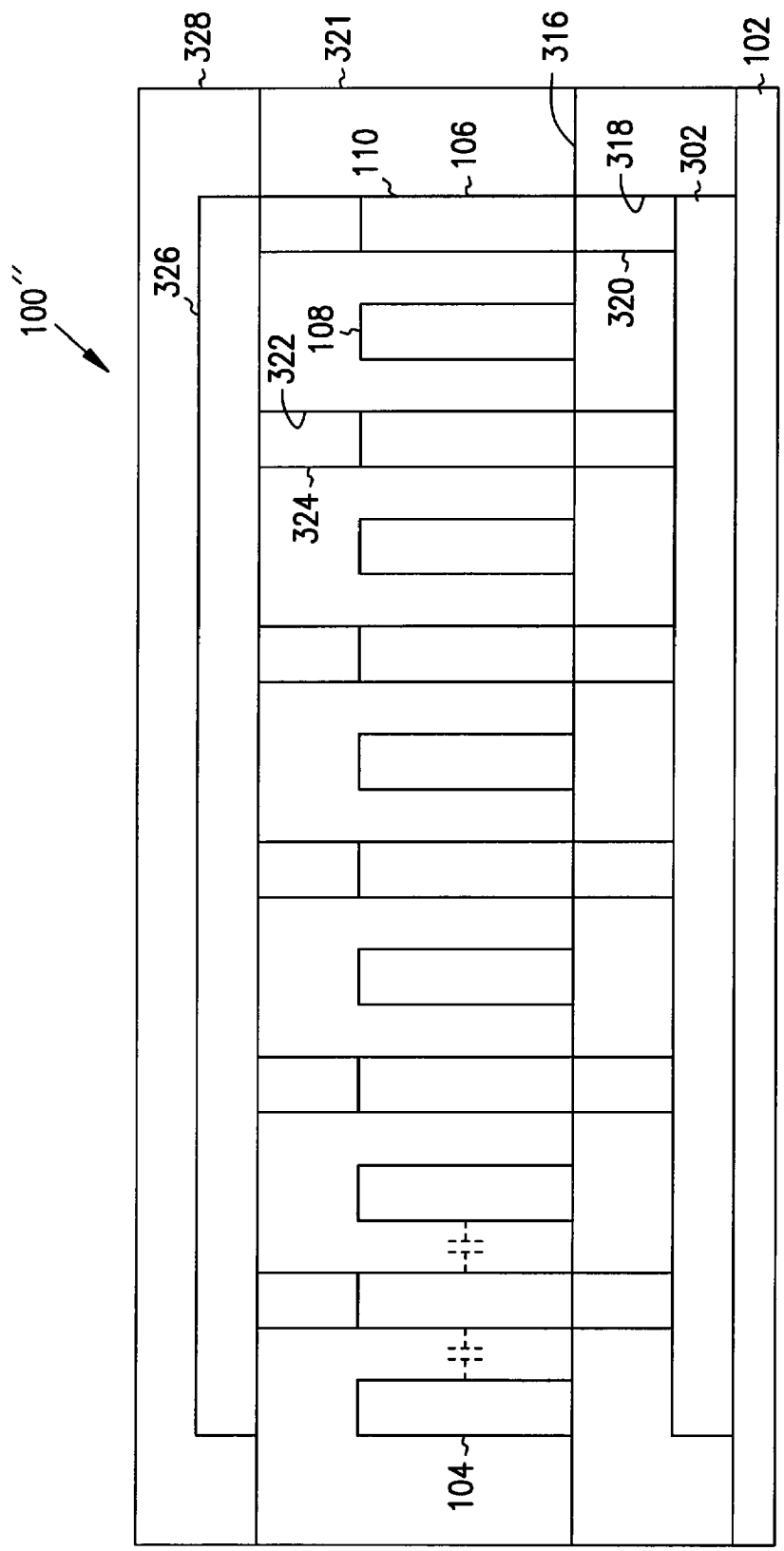
FIG. 4 is a side elevation view of a capacitor in accordance with a further embodiment of the present invention.

In another embodiment of the present invention shown in FIG. 4, a capacitor 100" is similar to the capacitor 100 in FIGS. 1 and 2 and includes a first reference plate or layer 302 of conductive or semiconductive material formed on the substrate 102 or silicon wafer. A layer of insulation material 316 is disposed over the first reference plate 302. At least one hole or via 318 is formed in the insulation layer 316 and contacts or plugs 320 are formed in the vias 318 to electrically connect the first reference plate 302 to the teeth 110 of one of the first or second portions 106 or 108. A layer of conductive material 104 is deposited on the insulation layer 316 and is etched to form the first portion 106 and the second portion 108. The first and second portions 106 and 108 will preferably be formed in a predetermined pattern to provide the maximum amount of juxtaposed surface area and therefore the maximum amount of capacitance per unit of area of the substrate 102 similar to that described with respect the capacitor 100 in FIGS. 1 and 2. Accordingly, the first and second portions 106 and 108 may also be comb-like structures similar to those in FIGS. 1 and 2; although other patterns may be used as well to provide a predetermined capacitance value. A further layer of insulation material 321 is deposited over the first and second portions 106 and 108. At least one hole or via 322 is formed through the insulation material 321 exposing whichever of the first or second portions 106 or 108 that is contacted by the first reference plate 302. A plug or contact 324 of conductive material is deposited in the hole 322 in contact with the first or second portion 106 or 108. A second reference plate 326 of conductive or semiconductive material is then deposited on the insulation material layer 321 and in contact with the at least one plug 324. Accordingly, the reference plates 302 and 326 form additional capacitance with whichever of the first and second portions 106 or 108 that is not connected by the plugs 320 and 324 to the first and second reference plates 302 and 326. The plugs 320 and 324 may be made from tungsten. The first portion 106 and the second portion 108 may also be made from tungsten or may be two metalization layers separated by a thicker layer of tungsten similar to the teeth 110 shown in FIG. 3.

Figure 5:
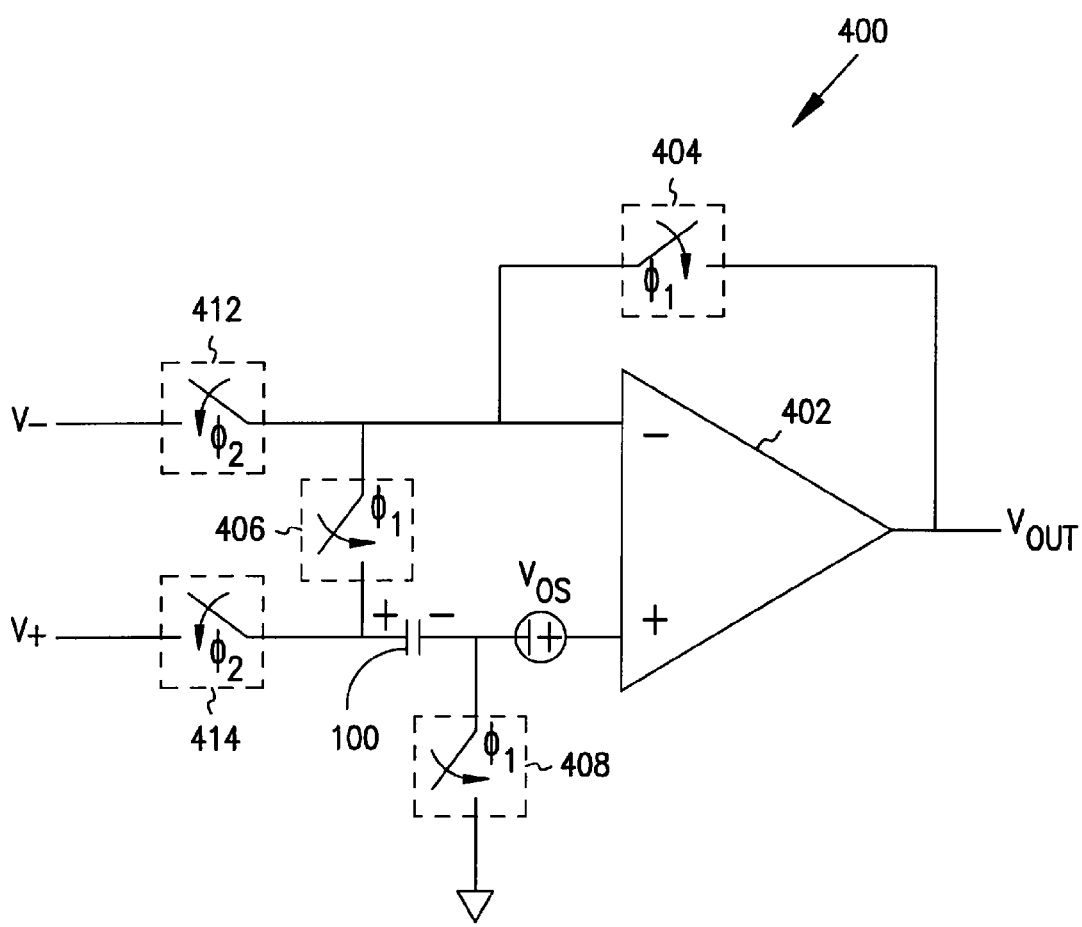
FIG. 5 is a schematic diagram of an offset or operational amplifier and offset capacitor in accordance with an embodiment of the present invention.

One application of the capacitor 100 is as an offset capacitor 100 in an operational amplifier circuit 400 to reduce or cancel the offset voltage (Vos) of an operational amplifier 402 as shown in FIG. 5. The offset capacitor 100 may be connected to the non-inverting or positive input of the operational amplifier 402. A first switch 404 is connected between an output (Vout) of the amplifier 402 and an inverting or negative input of the amplifier 400. A second switch 406 is connected between the inverting input of the amplifier 402 and one side of the capacitor 100. The other side of the capacitor 100 is connected to the non-inverting input of the amplifier 402, and a third switch 408 is connected between the other side of the capacitor 100 at a node 410 and ground. Another pair of switches 412 and 414 respectively connect or disconnect any input signals V− or V+ from the inverting and non-inverting inputs of the amplifier 402.

In operation, a timing signal $\phi_1$ may be generated by a controller or processor (not shown in FIG. 5) to close switches 404, 406 and 408. The capacitor 100 will then be charged to the level of the offset voltage Vos but with the opposite polarity of the offset voltage to nullify or cancel the offset voltage during normal operation of the amplifier 402. After a predetermined time delay to fully charge the capacitor 100 to the offset voltage, switches 404, 406 and 408 are opened or another signal may be generated to open switches 404, 406 and 408, and a timing signal $\phi_2$ is generated to connect any input signals to the operational amplifier 402. The offset capacitor 100 will then cancel the offset voltage Vos to provide a stable output voltage Vout that is independent of the input voltage and frequency.

Figure 6:
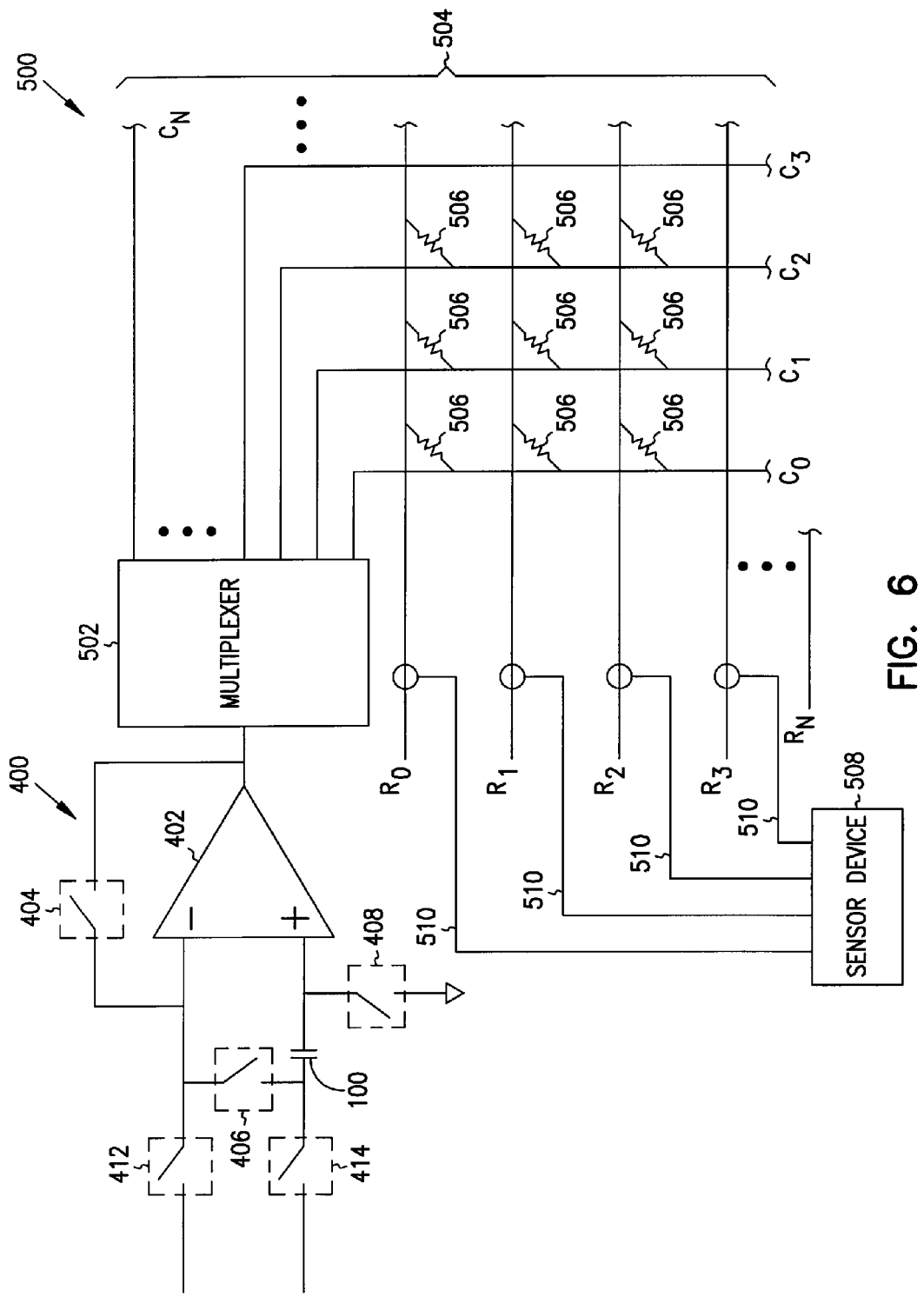
FIG. 6 is schematic diagram of a portion of a memory device or system including an operational amplifier and offset capacitor in accordance with an embodiment of the present invention.

Referring to FIG. 6, one application of the operational amplifier circuit 400 of FIG. 5 is to drive the column lines of a magnetic random access memory (MRAM) device or system 500. A simplified schematic diagram of a portion of an MRAM system 500 is shown in FIG. 6. The amplifier 402 is preferably connected to a multiplexer 502 and the multiplexer 502 is connected to a plurality of column lines $C_0$-$C_n$. A plurality of amplifier circuits 400 could be used rather than the multiplexer 502 with an amplifier circuit 400 being connected to each column line; however, the plurality of amplifier circuits 400 would occupy much more area on a substrate or semiconductor die (not shown in FIG. 6) that is better used for other components such a memory array 504 or matrix. The memory array 504 includes a plurality of resistive elements or memory elements 506. Each memory element 506 is connected between each column line $C_0$-$C_n$ and row line $R_0$-$R_n$. A sensor device 508 is connected by leads 510 to each of the row lines to sense the current when a row line is active to retrieve or read information from the MRAM system 500. The current in an active row line should be precise for sensing to function correctly. Accordingly, to provide an accurate current level and proper sensing, the associated column lines must be held at a stable, constant reference voltage level. A variation of one or two millivolts could provide erroneous sensing of the row lines. Accordingly, the reference output voltage Vout from the amplifier circuit 400 that is applied to the column lines must be very stable and not influenced by the offset voltage of the operational amplifier 402. The capacitor 100 must therefore accurately nullify the offset voltage and not be influenced or vary as a result of voltage or frequency changes associated with the input signals; in other words, the capacitor 100 should be independent of voltage and frequency.

The present invention provides a relatively large bipolar capacitor in terms of the number of microfarads per unit of die area compared to other uses of capacitors in memory circuits which have capacitances on the order of nanofarads or femtofarads per unit of area. As described above, the large capacitance values are required in the MRAM amplifier circuit to provide the very stable line voltage for sensing and reading of the row lines for proper operation of the MRAM system. The three dimensional capacitor structures of the present invention pack the largest surface area between capacitor plates in the smallest footprint or die area (IC real estate) to provide additional die area for memory elements.

While the memory device 500 has been described with respect to the amplifier circuit 400 being connected to the column lines, the memory array 504 is substantially symmetrical and the row and column lines could be interchanged such that the amplifier circuit 400 could just as well be connected to the row lines and the column lines could be read or sensed by the sensor device 508.

Figure 7:
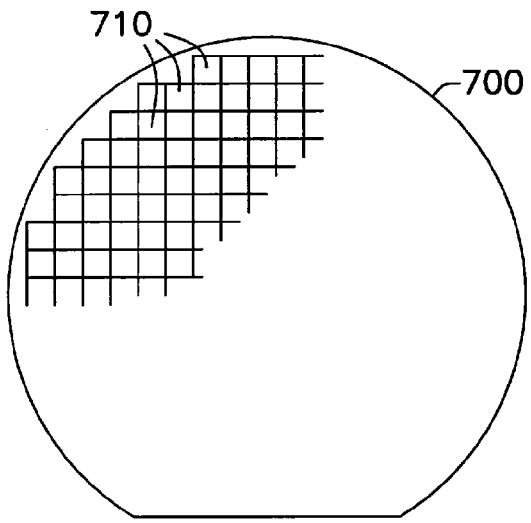
FIG. 7 is a top view of a wafer or substrate containing semiconductor dies in accordance with an embodiment of the present invention.

With reference to FIG. 7, in one embodiment, a semiconductor die 710 is produced from a silicon wafer 700. The die 710 is an individual pattern, typically rectangular, on a substrate that contains circuitry to perform a specific function. A semiconductor wafer 700 will typically contain a repeated pattern of such dies 710 containing the same functionality. Die 710 may contain circuitry for the capacitor 100, operational amplifier circuit 400 and memory device 500 or other device with which the capacitor 100 may be utilized, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die 710 for unilateral or bilateral communication and control.

Figure 8:
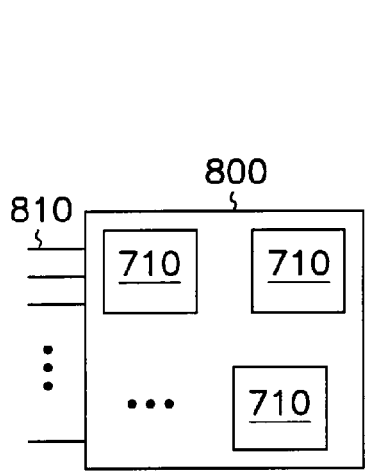
FIG. 8 is a block diagram of an exemplary circuit module in accordance with an embodiment of the present invention.

As shown in FIG. 8, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules, multiple voltage supply switches 100 and control circuits 200 and may include multi-layer, multi-chip modules. Circuit module 800 may be a sub-component of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 9:
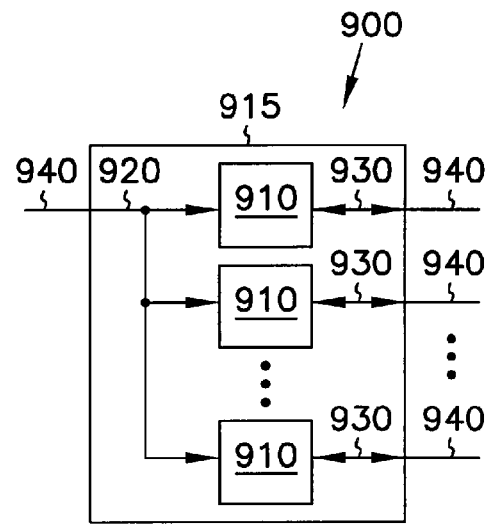
FIG. 9 is a block diagram of an exemplary memory module in accordance with an embodiment of the present invention.

FIG. 9 shows one embodiment of a circuit module as a memory module 900. Memory module 900 generally depicts a Single In-line Memory Module (SIMM) or Dual In-line Memory Module (DIAM). A SIMM or DIAM is generally a printed circuit board (PCB) or other support containing a series of memory devices. While a SIMM will have a single in-line set of contacts or leads, a DLAM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 9. The memory module 900 or memory devices 910 may also include the multiple voltage switch 100 and control circuit 200 to provide application of different voltages to the memory devices 910 to enable the memory devices to perform different functions or operations or to place the memory devices 910 in different modes as previously described.

Figure 10:
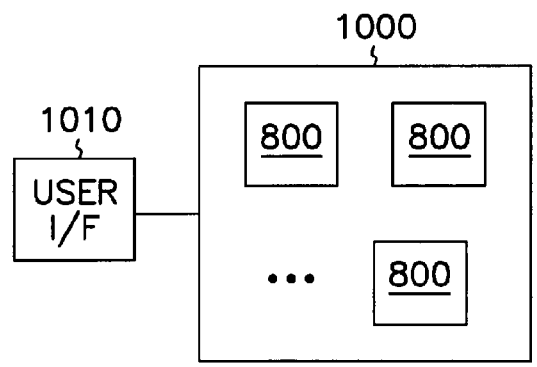
FIG. 10 is a block diagram of an exemplary electronic system in accordance with the present invention.

FIG. 10 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. One or more of the circuit modules 800 may also include a multiple voltage switch 100 and control circuit 200 to facilitate the application of different voltage levels to other components in the circuit module 800 or to other circuit modules 800 in the electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a sub-component of a larger electronic system.

Figure 11:
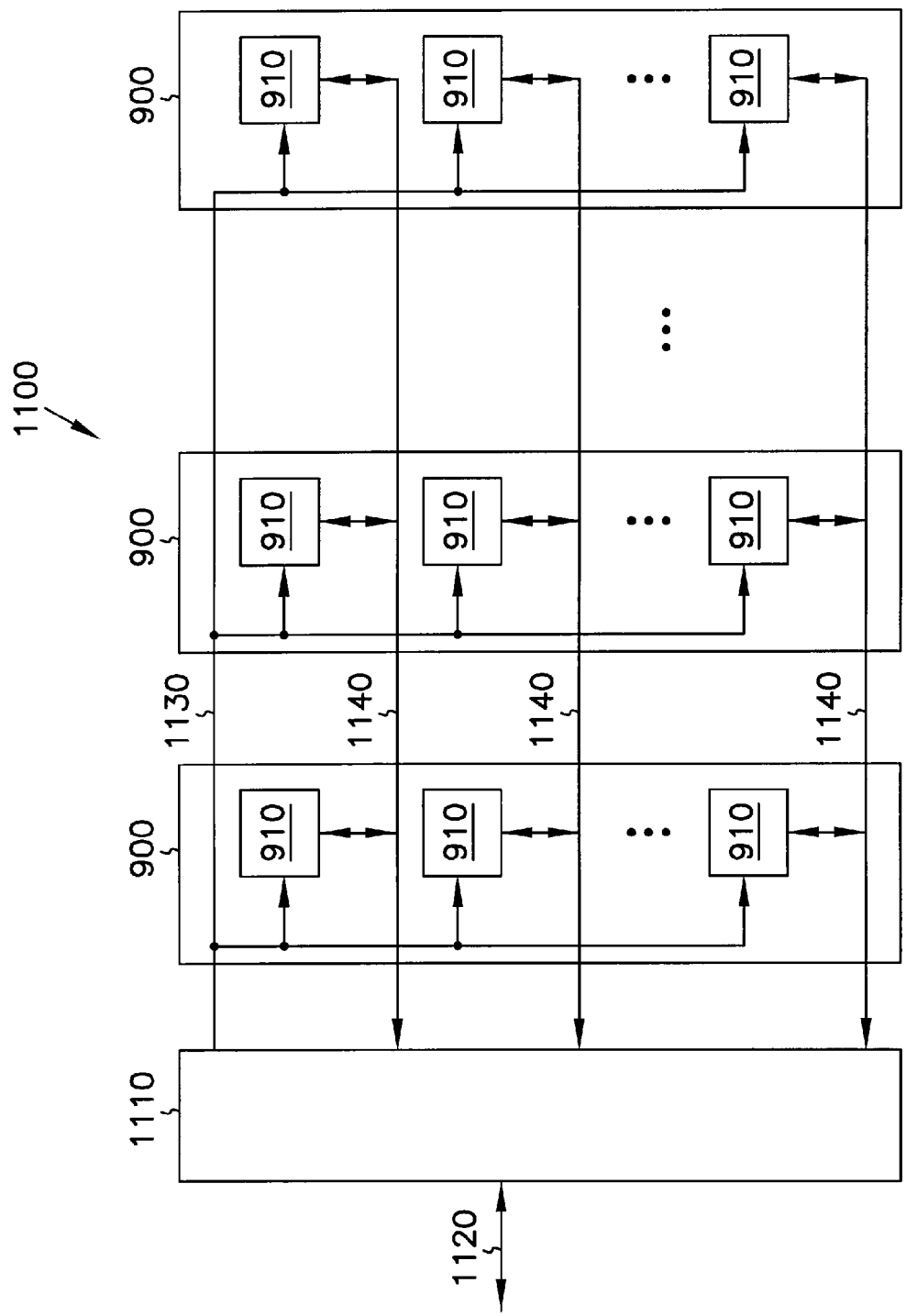
FIG. 11 is a block diagram of an exemplary memory system in accordance with the present invention.

FIG. 11 shows one embodiment of an electronic system as a memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140. Memory system 1100 may include memory devices such as the MRAM device 500 of FIG. 6.

Figure 12:
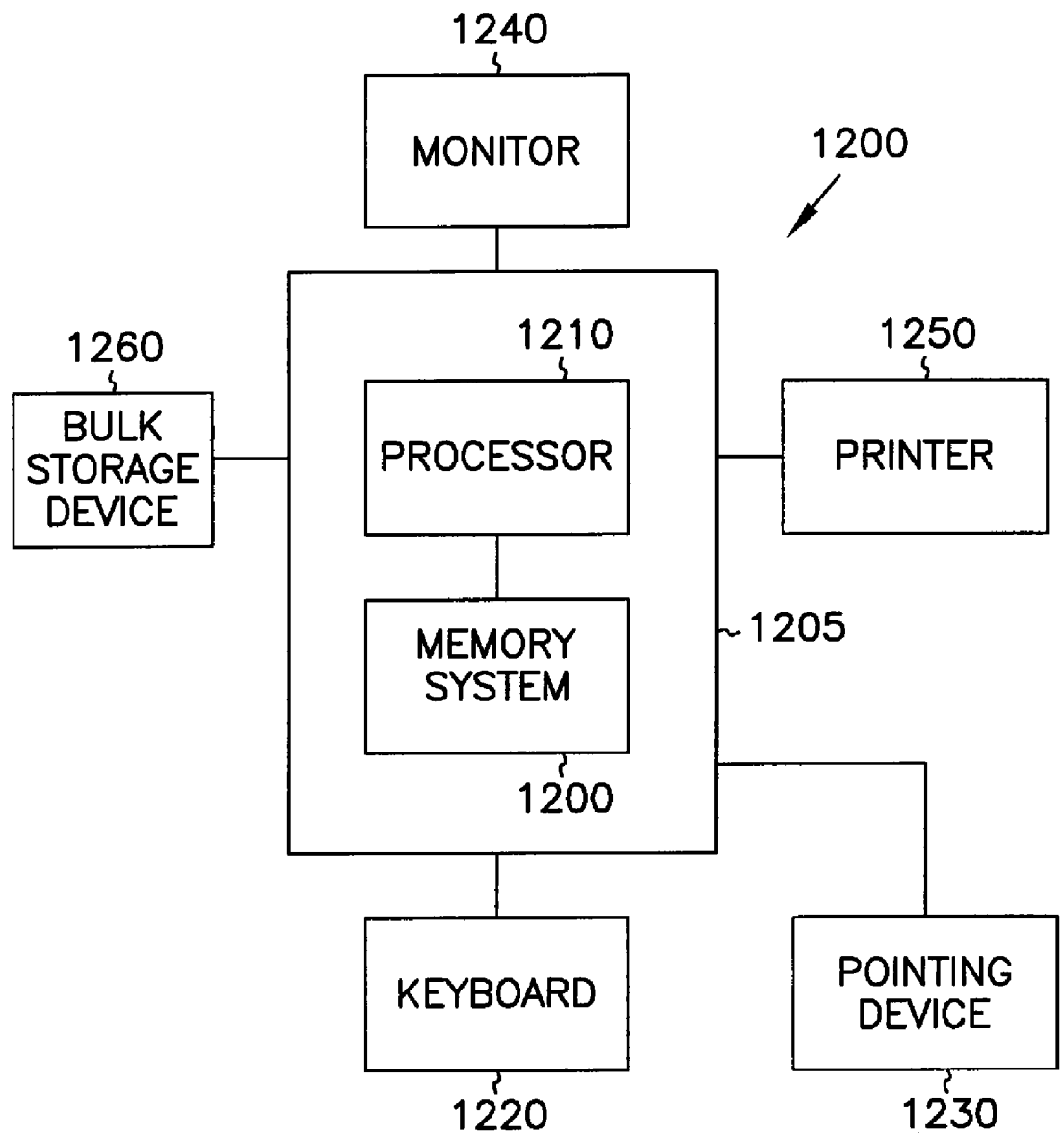
FIG. 12 is a block diagram of an exemplary computer system in accordance with the present invention.

FIG. 12 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e. memory system 1100, as a sub-component. Computer system 1200 optionally contains user interface components. Depicted in FIG. 12 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor 1210 and the memory system 1100.

In accordance with the present invention, a capacitor includes a layer of conductive material formed on a substrate or semiconductor die. The layer of conductive material includes a first portion and a second portion. The first and second portions are arranged in a predetermined pattern relative to one another to provide a maximum amount of capacitance per unit of area on the substrate or semiconductor die.

In accordance with one embodiment of the present invention, the first portion and the second portion of the layer of conductive material each have a substantially comb-like structure with a plurality of teeth. The teeth of the first portion and the teeth of the second portion are interleaved and each tooth includes a pair of sidewalls. Each sidewall, except an outside sidewall of an end tooth, faces a sidewall of a tooth of the other portion to provide a maximum of juxtaposed surface area.

In accordance with another embodiment of the present invention, an integrated circuit includes an amplifier formed on a substrate or semiconductor die and a capacitor formed on the substrate and connected to an input of the amplifier. The capacitor includes a first substantially comb-like structure of conductive material with a plurality of teeth and a second substantially comb-like structure of conductive material also with a plurality of teeth. The teeth of the second substantially comb-like structure are interleaved with the teeth of the first substantially comb-like structure and each tooth of the first and second comb-like structures have a pair of sidewalls. Each sidewall has a selected surface area and each of the teeth of the first and second comb-like structures are separated by a gap of a chosen width to provide a predetermined capacitance.

In accordance with another embodiment of the present invention, a memory system includes an array of memory elements. Each memory element is connected by one of plurality of row lines and by one of a plurality of column lines. An amplifier is connected to at least one of each of the plurality of column lines or each of the plurality of row lines. A capacitor is connected to an input of each amplifier to cancel the offset voltage of the amplifier. The capacitor includes a layer of conductive material having a first portion and a second portion. The first portion and the second portion are arranged in a predetermined pattern relative to one another to provide a maximum amount of capacitance per given area of the substrate or semiconductor die.

In accordance with a further embodiment of the present invention, a electronic system includes a processor and a memory device coupled to the processor. The memory device includes an array of memory elements and each memory element is connected by one of a plurality of row lines and by one of a plurality of column lines. An amplifier is connected to at least one of each of the plurality of row lines or to each of the plurality of column lines. A capacitor is connected to an input of each amplifier to cancel the offset voltage. Each capacitor includes a layer of conductive material divided into a first portion and a second portion. The first and second portions are arranged in a predetermined pattern relative to one another to provide a maximum amount of capacitance per given area of a substrate or semiconductor die.

In accordance with a further embodiment of the present invention, a method for making a capacitor includes depositing at least one layer of conductive material on a substrate; removing material from the layer of conductive material to form a first and second portion arranged in a predetermined pattern relative to one another to provide a maximum amount of capacitance per area of the substrate or wafer.

In accordance with another embodiment of the present invention, a method for correcting for offset voltage in an amplifier includes: connecting an output of the amplifier to an inverting input of the amplifier; connecting a capacitor between the inverting input and a positive or non-inverting input of the amplifier, wherein the capacitor comprises a layer of conductive material including at least a first portion and a second portion and wherein the first portion and the second portion are arranged in a predetermined pattern relative to one another to provide a maximum capacitance per area; and connecting the positive input of the amplifier to ground to cause the capacitor to charge to the offset voltage.

In accordance with a further embodiment of the present invention, a method for applying a stable voltage to a column or a row line of a memory device includes forming an amplifier and connecting an output of the amplifier to one of the row line or the column line; forming a capacitor connected to an input of the amplifier, wherein the capacitor is formed by depositing at least one layer of conductive material and removing material from the at least one layer of conductive material to form a first portion and a second portion that are arranged in a predetermined pattern relative to one another to provide a maximum capacitance per area of a semiconductor wafer or die; and forming circuitry to charge the capacitor to an opposite polarity of the offset voltage to nullify the offset voltage of the amplifier.

While the three dimensional capacitor structures of the present invention have been described with respect to use in an amplifier circuit and memory circuits, it should be noted that the three dimensional capacitor structures may be used in any circuit where a relatively large capacitance value is needed but design constraints or available die area necessitate that the capacitor occupies the smallest possible footprint on the die or wafer. The present invention packs the largest surface area between capacitor plates into the smallest footprint on a semiconductor die or wafer.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An integrated circuit memory device, comprising:
    a multi-resistive memory array;
    a circuit connected to the multi-resistive memory array and adapted to provide a stable voltage to the multi-resistive memory array, the circuit including a capacitor, the capacitor includes:
        a substrate;
        a first plurality of interconnected strips of a conductive material formed on the substrate;
        a second plurality of interconnected strips of conductive material formed on the substrate, wherein the second plurality of strips are interleaved with the first plurality of strips; and
        insulation material disposed between each of the first plurality of strips and each of the interleaved second plurality of strips; and
    a sensor device connected to the multi-resistive memory array and adapted to read information from the multi-resistive memory array.

2. The integrated circuit memory device of claim 1, wherein each strip has a sidewall and wherein the first plurality of strips and the second plurality of strips are interleaved in a predetermined pattern to provide a maximum of juxtaposed sidewall surface area of the first plurality of strips and the second plurality of strips.

3. The integrated circuit memory device of claim 1, wherein each strip has a sidewall of a selected height and length and wherein the first plurality of strips and the second plurality of strips are interleaved in a predetermined pattern to provide the maximum capacitance per selected area of the substrate.

4. The integrated circuit memory device of claim 1, wherein the multi-resistive memory array includes a magnetic random access memory device.

5. The integrated circuit memory device of claim 4, wherein the second plurality of strips include tungsten.

6. The integrated circuit memory device of claim 4, wherein the capacitor is to provide a number of microfarads per unit of substrate area.

7. The integrated circuit memory device of claim 1, wherein the substrate includes silicon.

* * * * *

UNITED STATES PATENT AND TRADEMARK OFFICE
CERTIFICATE OF CORRECTION

PATENT NO.       : 7,642,591 B2                                    Page 1 of 1
APPLICATION NO.  : 11/379441
DATED            : January 5, 2010
INVENTOR(S)      : Baker et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 910 days.

Signed and Sealed this

Sixteenth Day of November, 2010

David J. Kappos
*Director of the United States Patent and Trademark Office*